(12) United States Patent
Kasamatsu et al.

(10) Patent No.: US 12,218,648 B2
(45) Date of Patent: *Feb. 4, 2025

(54) ACOUSTIC WAVE ELEMENT, FILTER ELEMENT, AND COMMUNICATION APPARATUS

(71) Applicant: KYOCERA Corporation, Kyoto (JP)

(72) Inventors: Naofumi Kasamatsu, Uji (JP); Masahisa Shimozono, Takatsuki (JP); Tetsuya Kishino, Nara (JP); Masaki Nanbu, Katano (JP); Hongnian Li, Moriyama (JP); Tatsuya Doumoto, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/199,122

(22) Filed: May 18, 2023

(65) Prior Publication Data

US 2023/0291382 A1  Sep. 14, 2023

Related U.S. Application Data

(63) Continuation of application No. 16/628,568, filed as application No. PCT/JP2018/025581 on Jul. 5, 2018, now Pat. No. 11,689,182.

(30) Foreign Application Priority Data

Jul. 6, 2017  (JP) ................... 2017-133036

(51) Int. Cl.
*H03H 9/145* (2006.01)
*H03H 9/02* (2006.01)
(Continued)

(52) U.S. Cl.
CPC .... *H03H 9/14541* (2013.01); *H03H 9/02559* (2013.01); *H03H 9/14502* (2013.01); *H03H 9/25* (2013.01); *H03H 9/6483* (2013.01)

(58) Field of Classification Search
CPC .......... H03H 9/14541; H03H 9/02559; H03H 9/14502; H03H 9/6483
See application file for complete search history.

(56) References Cited

U.S. PATENT DOCUMENTS 8,035,464 B1   10/2011  Abbott et al.
11,689,182 B2 * 6/2023   Kasamatsu ........ H03H 9/14541
                                                   310/313 B
(Continued)

FOREIGN PATENT DOCUMENTS

JP    2002-185283 A   6/2002
JP    2005-516517 A   6/2005
(Continued)

*Primary Examiner* — Samuel S Outten
(74) *Attorney, Agent, or Firm* — Procopio, Cory, Hargreaves & Savitch LLP

(57) ABSTRACT

An acoustic wave element 1 according to the present disclosure includes a piezoelectric substrate 2 and an IDT electrode 3 on the piezoelectric substrate 2. The IDT electrode 3 includes a multilayer structure of a first layer 35 comprised of Al containing 10% or less of a sub-component and a second layer 37 comprised of a $CuAl_2$ alloy. The second layer 37 enables the acoustic wave element 1 to have excellent electric power resistance.

11 Claims, 15 Drawing Sheets

(51) Int. Cl.
 *H03H 9/25* (2006.01)
 *H03H 9/64* (2006.01)

(56) References Cited

U.S. PATENT DOCUMENTS

| 2002/0113526 | A1 | | 8/2002 | Nishihara |
| 2003/0146674 | A1 | | 8/2003 | Jacot et al. |
| 2009/0121584 | A1 | * | 5/2009 | Nishimura ......... H03H 9/14541 |
| | | | | 310/313 B |

FOREIGN PATENT DOCUMENTS

| JP | 2007-214902 A | 8/2007 |
| JP | 2018-014715 A | 1/2018 |
| WO | 2017/111170 A1 | 6/2017 |

* cited by examiner

ACOUSTIC WAVE ELEMENT, FILTER ELEMENT, AND COMMUNICATION APPARATUS

RELATED APPLICATIONS

This Application is a continuation of U.S. application Ser. No. 16/628,568, filed Jan. 3, 2020 and titled "ACOUSTIC WAVE ELEMENT, FILTER ELEMENT, AND COMMUNICATION APPARATUS" which is a national stage filing under 35 U.S.C. § 371 of international application number PCT/JP2018/025581, filed Jul. 5, 2018, which claims the benefit of Japanese application number JP 2017-133036, filed on Jul. 6, 2017, each of which is herein incorporated by reference in its entirety.

TECHNICAL FIELD

The present invention relates to an acoustic wave element, a filter element, and a communication apparatus.

Background Art

In recent years, in a mobile terminal or another communication apparatus, an acoustic wave element has been used for a multiplexer which filters signals transmitted to and received from an antenna. The acoustic wave element is configured by a piezoelectric substrate and an excitation electrode formed on the piezoelectric substrate. The acoustic wave element utilizes the characteristic of being able to convert an electrical signal and a surface acoustic wave to each other by the relationship between the excitation electrode and the piezoelectric substrate.

The multiplexer for example configures a receiving filter and a transmission filter by using a plurality of acoustic wave elements (see Patent Literature 1 etc.). In the multiplexer, a plurality of acoustic wave elements are combined to set passing bands of the reception band and transmission band.

CITATION LIST

Patent Literature

Patent Literature 1: Japanese Patent Publication No. 2007-214902

SUMMARY OF INVENTION

Technical Problem

In such a multiplexer, raising the electric power resistance has been demanded. In order to raise the electric power resistance of the multiplexer, it is necessary to raise the electric power resistance of the acoustic wave element configuring that.

The present disclosure was made in consideration of such an actual circumstance and has as an object thereof to provide an acoustic wave element, a filter element, and a communication apparatus which have high electric power resistances.

Solution to Problem

An acoustic wave element according to one embodiment of the present disclosure includes a piezoelectric substrate and an IDT electrode which is located on the piezoelectric substrate and includes a multilayer structure of a first layer comprised of Al containing a sub-component in an amount less than 10% and a second layer comprised of a $CuAl_2$ alloy.

A filter element according to one embodiment of the present disclosure includes an acoustic wave element disclosed above and a serial resonator and a parallel resonator on the piezoelectric substrate. They are connected in a ladder shape.

A communication apparatus according to one embodiment of the present disclosure includes an antenna, the filter element disclosed above which is electrically connected to the antenna, and an RF-IC which is electrically connected to the filter element.

Advantageous Effect of Invention

According to the acoustic wave element, filter element, and communication apparatus of the present disclosure, an electric power resistance can be raised.

DESCRIPTION OF EMBODIMENTS

Figure 1:
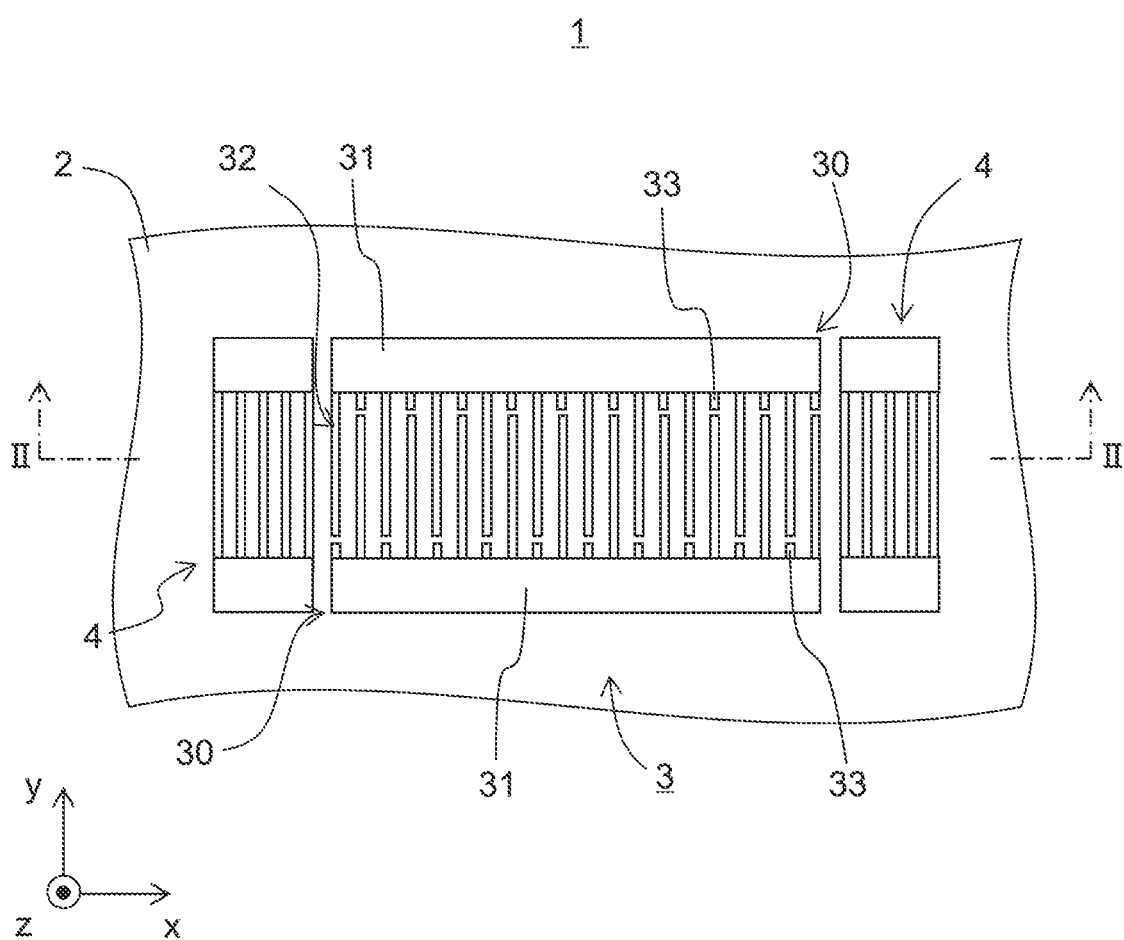
FIG. 1 is a plan view showing the configuration of an acoustic wave element according to one embodiment of the present disclosure.

Below, an acoustic wave element, filter element, and communication apparatus according to embodiments of the present disclosure will be explained with reference to the drawings. Note that, the drawings used in the following explanation are schematic ones. Size ratios etc. in the drawings do not always coincide with the actual ones.

In the acoustic wave element, any direction may be defined as "above" or "below". In the following explanation, however, for convenience, an orthogonal coordinate system xyz will be defined, and sometimes the "upper surface" or "lower surface", and other terms will be used where the positive side of the z-direction is the upper part.

<Outline of Configuration of Acoustic Wave Element>

Figure 2:
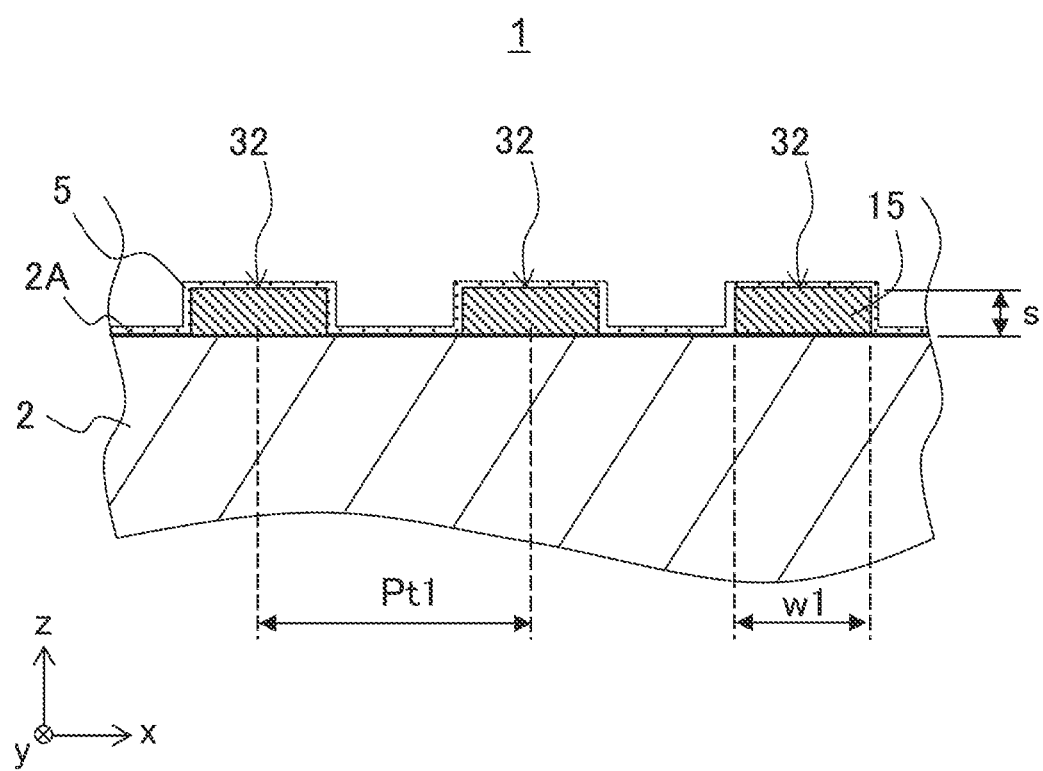
FIG. 2 is an enlarged view of a principal part of a cross-section cut along a II-II line in the acoustic wave element in FIG. 1.

FIG. 1 is a plan view showing the configuration of an acoustic wave (SAW: surface acoustic wave) element 1 according to one embodiment of the present disclosure. FIG. 2 is an enlarged cross-sectional view of a principal part taken along the II-II line in FIG. 1. The SAW element 1, as shown in FIG. 1, has a piezoelectric substrate 2 and an excitation (IDT: interdigital transducer) electrode 3 and reflectors 4 which are all provided on the upper surface 2A of the piezoelectric substrate 2.

The piezoelectric substrate 2 is configured by a substrate of a single crystal having a piezoelectric characteristic comprised of a lithium niobate crystal or lithium tantalate (LiTaO$_3$, below, referred to as an "LT") crystal. In the present example, the explanation will be given taking as an example a case where use is made of a Y-rotated and X-propagated LT substrate. Note that, the cut angle of the LT substrate will be explained later. The planar shape and various dimensions of the piezoelectric substrate 2 may be suitably set. As one example, the thickness (z-direction) of the piezoelectric substrate 2 is 0.2 mm to 0.5 mm.

The IDT electrode 3, as shown in FIG. 1, has two comb-shaped electrodes 30. The comb-shaped electrodes 30, as shown in FIG. 1, have two bus bars 31 facing each other and pluralities of electrode fingers 32 extending from the bus bars 31 toward the other bus bar 31 sides. Further, the pair of comb-shaped electrodes 30 are arranged so that the electrode fingers 32 connected with one and the electrode fingers 32 connected with the other intermesh (intersect) with each other in a direction of propagation of the acoustic wave.

Further, the comb-shaped electrodes 30 have dummy electrode fingers 33 facing electrode fingers 32. Note that, dummy electrode fingers 33 need not be arranged.

The bus bars 31 are for example substantially formed in long shapes so as to linearly extend with constant widths. Accordingly, the edge parts in the bus bars 31 on the sides where they face each other are linear-shaped. The pluralities of electrode fingers 32 are for example substantially formed in long shapes so as to linearly extend with constant widths and are arranged in the direction of propagation of the acoustic wave at substantially constant intervals.

The pluralities of electrode fingers 32 in the pair of comb-shaped electrodes 30 configuring the IDT electrode 3 are set so as to have a pitch Pt1. The pitch Pt1 is for example set so as to be equal to the half wavelength of the wavelength λ of the acoustic wave at a frequency at which resonance is intended to be caused. The wavelength λ (that is 2×Pt1) is for example 1.5 um to 6 μm. The IDT electrode 3 is arranged so that the pluralities of electrode fingers 32 have a constant cycle by arranging almost all of the pluralities of electrode fingers 32 to have the pitch Pt1, so can generate an acoustic wave with a high efficiency.

Here, the "pitch Pt1" designates the interval from the center of one electrode finger 32 to the center of the other electrode finger 32 which is adjacent to the one electrode finger 32 in the direction of propagation. In each electrode finger 32, the width w1 in the direction of propagation of the acoustic wave is suitably set in accordance with the electrical characteristics demanded from the SAW element 1 and so on. The width w1 of the electrode finger 32 is for example 0.3 time to 0.7 time the pitch Pt1.

By arranging the electrode fingers 32 in this way, an acoustic wave propagating in a direction perpendicular to the pluralities of electrode fingers 32 is generated. Accordingly, after considering the crystal orientation of the piezoelectric substrate 2, the two bus bars 31 are arranged so as to face each other in a direction crossing the direction in which the acoustic wave is intended to be propagated. The pluralities of electrode fingers 32 are formed so as to extend in the direction perpendicular with respect to the direction in which the acoustic wave is intended to be propagated. Note that, the direction of propagation of the acoustic wave is defined according to the orientation of the pluralities of electrode fingers 32 and so on. In the present embodiment, however, for convenience, sometimes the orientation of the pluralities of electrode fingers 32 etc. will be explained using the direction of propagation of the acoustic wave as the standard.

The number of the electrode fingers 32 is 50 to 350 per one side. The lengths of the pluralities of electrode fingers 32 (length from the bus bar to the tip ends) are for example set substantially the same. The length of mutual intermeshing of the facing electrode fingers 32 (intersecting width) is 10 to 300 μm.

The IDT electrode 3 is for example configured by a conductive layer 15 of metal. The material of this metal and the thickness S (z-direction) of this conductor layer 15 will be explained later.

The IDT electrode 3 may be directly arranged on the upper surface 2A of the piezoelectric substrate 2 or may be arranged on the upper surface 2A of the piezoelectric substrate 2 through an underlying layer configured by another member. The other member is for example comprised of Ti, Cr, or an alloy of the same or the like. When the IDT electrode 3 is arranged on the upper surface 2A of the piezoelectric substrate 2 through an underlying layer, the thickness of the other member is set to a thickness to an extent where almost no influence is exerted upon the electrical characteristics of the IDT electrode 3 (for example within a thickness of 5% of the thickness of the IDT electrode 3 in the case of Ti).

This underlying layer, when viewed by a cross-section, may be made larger in a width of a part contacting the piezoelectric substrate 2 than a width of a part contacting the electrode fingers 32 in the IDT electrode 3. In that case, the electric power resistance can also be raised by the underlying layer.

When a voltage is applied, the IDT electrode 3 excites an acoustic wave propagating in the x-direction near the upper surface 2A of the piezoelectric substrate 2. The excited acoustic wave is reflected at a boundary of the electrode fingers 32 with a region where the electrode fingers 32 are not arranged (long-shaped region between neighboring electrode fingers 32). Further, a standing wave having the pitch Pt1 of the electrode fingers 32 as a half wavelength is formed. The standing wave is converted to an electrical signal having the same frequency as that of this standing wave and is extracted by the electrode fingers 32. In this way, the SAW element 1 functions as a 1 port resonator.

The reflectors 4 are arranged so as to sandwich the IDT electrode 3 in the direction of propagation of the acoustic wave. The reflector 4 is formed in substantially a slit shape.

The protective layer 5, as shown in FIG. 2, is provided on the piezoelectric substrate 2 so as to cover the tops of the IDT electrode 3 and reflectors 4. Specifically, the protective layer 5 covers the surfaces of the IDT electrode 3 and reflectors 4 and covers the part of the upper surface 2A of the piezoelectric substrate 2 which is exposed from the IDT electrode 3 and reflectors 4. The thickness of the protective layer 5 is for example 1 nm or more, 20% or less of the thickness of the IDT electrode 3.

The protective layer 5 is made of a material having an insulation characteristic and contributes to protection from corrosion and the like. Further, the protective layer 5 may be formed by $SiO_2$ or another material making the propagation velocity of the acoustic wave faster when the temperature rises as well. Due to this, it is also possible to suppress a change of the electrical characteristics due to a change of the temperature of the acoustic wave element 1. Further, SiNx or another material may be used for improving a moisture resistance as well.

(Relationship between Piezoelectric Substrate 2 and IDT Electrode 3)

Conventionally, in an acoustic wave element, considering the excitation efficiency of the acoustic wave, radiation loss, electric resistance etc., here a configuration in which an IDT electrode comprised of Al having a thickness of about 8% of the wavelength ratio of the acoustic wave is provided on an LT substrate having a cut angle of 42° has been generally used (below, an acoustic wave element having this configuration will be referred to as a "comparative model").

As opposed to this, in recent years, the electric power of the high frequency signal input to an acoustic wave element has become larger, therefore an electrode which is more excellent in electric power resistance than an electrode comprised of Al has been demanded.

However, with just replacement by Mo or another electrode material which has a high strength, characteristics of the excitation efficiency of the acoustic wave, radiation loss, and electric resistance enough to enable replacement for an electrode made of Al could not be manifested since there is a tradeoff in these characteristics.

Therefore, in the SAW element 1 according to the present embodiment, first, Cu was selected as a material improving the electric power resistance and having the possibility of manifestation of characteristics substantially equal to those of current Al electrodes. Below, the specific configuration of the electrodes will be studied.

<Composition Ratio of Layer Containing Cu>

First, a composition ratio capable of raising the electric power resistance to the highest level as the layer containing Cu was studied. Specifically, an IDT electrode 3 formed by changing the composition ratio of Cu and Al was formed, and the electric power resistance thereof was measured.

Figure 3:
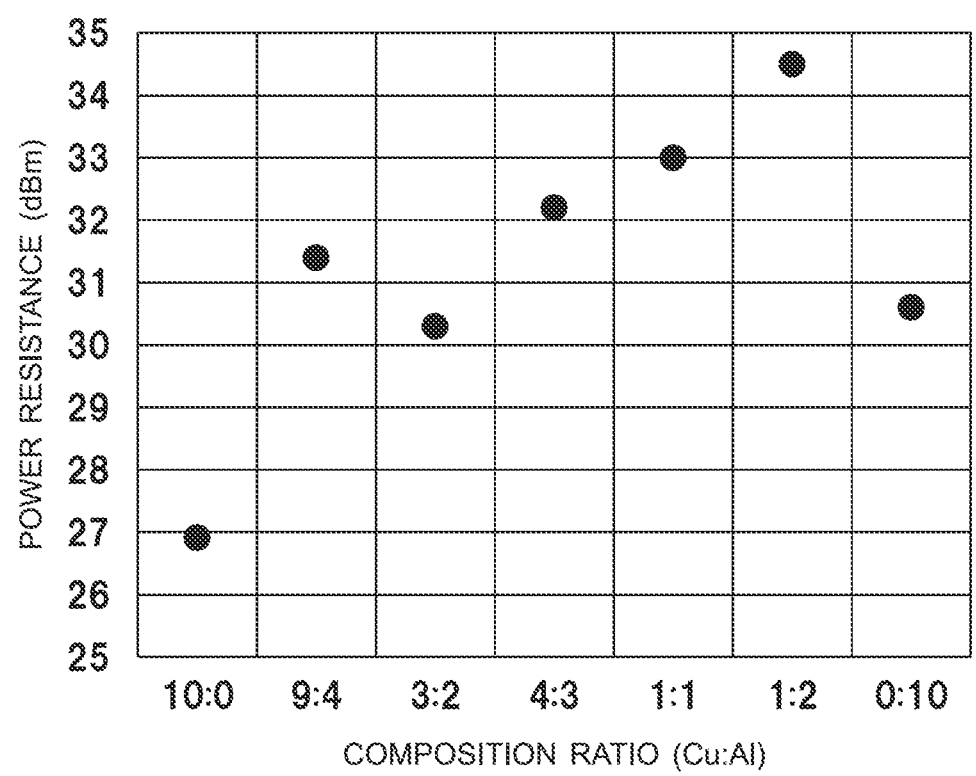
FIG. 3 is a graph showing correlation between a composition ratio and an electric power resistance of an electrode material.

The results thereof will be shown in FIG. 3. In FIG. 3, an abscissa shows the ratio of Cu and Al, and an ordinate shows the electric power resistance (dBm). Note that, as the composition ratio of Cu and Al, a value which existed as a Cu—Al alloy was set. Note that, in the case of 100% of Cu, the Cu was oxidized during an electric power resistance test and a low electric power resistance was exhibited. Further, in a case of 100% of Al, the electric power resistance was that of the comparative model. As a result of this, it was confirmed that the electric power resistance was improved compared with the comparative model in any case other than a composition ratio of Cu and Al of 3:2. In particular, it was confirmed that the electric power resistance could be raised the most when using an alloy of a composition ratio of Cu and Al of 1:2 (that is, $CuAl_2$ alloy). Due to this, the layer containing Cu was configured by a $CuAl_2$ alloy. By configuring the layer containing Cu by an alloy, oxidation reduction become harder compared with the layer configured by Cu alone, therefore the reliability as an electrode can be raised.

<Electrode Configuration of IDT Electrode 3>

Figure 4:
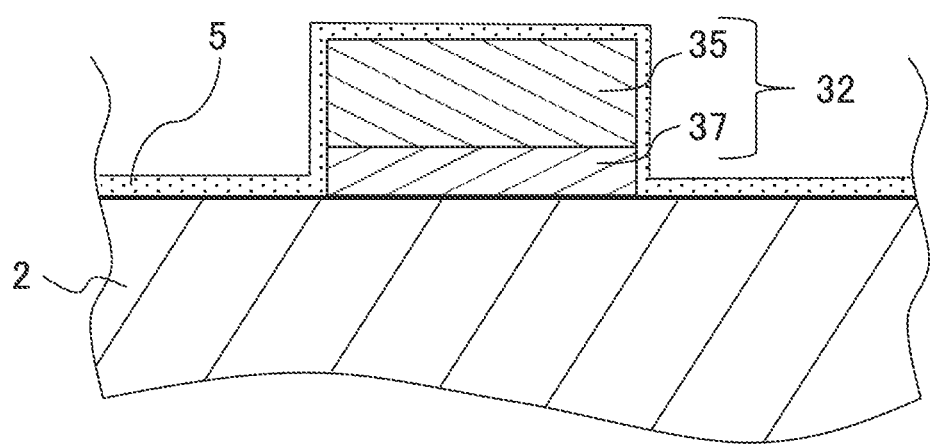
FIG. 4 is an enlarged cross-sectional view of the principal part enlarging a part in an IDT electrode.
Figure 4:
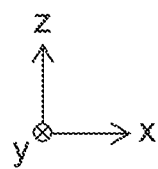

From the viewpoint of electric power resistance, preferably use is made of a layer configured by $CuAl_2$ as the IDT electrode 3. However, the inventors studied the configuration of the IDT electrode 3 in order to simultaneously improve the excitation efficiency of the acoustic wave, radiation loss, and other characteristics. Specifically, as shown in FIG. 4, a model configured by a multilayer structure of a first layer 35 comprised of Al and a second layer 36 containing Cu (comprised of $CuAl_2$) was prepared as the IDT electrode 3, and the excitation efficiency of the acoustic wave, radiation loss and other characteristics at the time when the relationships between the cut angle of the piezoelectric substrate 2 and the thicknesses of the layers in the IDT electrode 3 were made different were simulated. Specifically, a combination of thicknesses giving the smallest loss in the resonance frequency in each model was found. The optimum ratios of the thickness of the first layer 35 and the second layer 37 at the different cut angles found from the results of simulation are shown in FIG. 5.

Figure 5:
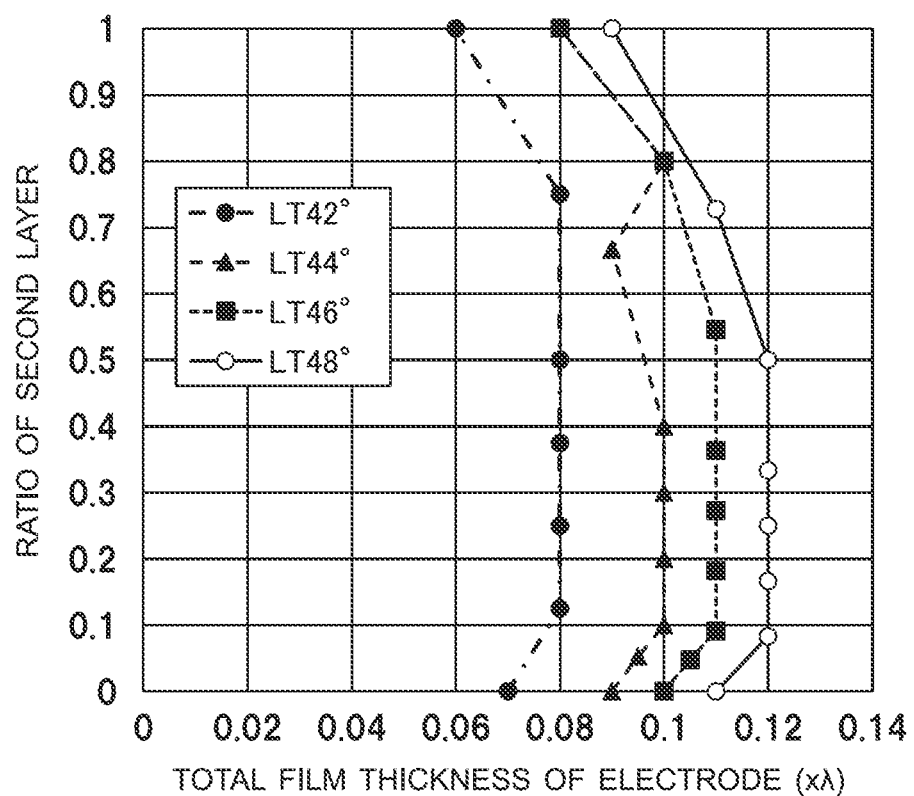
FIG. 5 is a graph showing a relationship between a total thickness of an IDT electrode 3 excellent in resonance characteristic and the ratio of a second layer in the total thickness in the acoustic wave element in FIG. 1.

In FIG. 5, the abscissa shows the total of the thicknesses (below, also referred to as the "total thickness") of the IDT electrode 3 by the wavelength ratio, while the ordinate shows the ratio of the second layer 37 relative to the total thickness of the IDT electrode 3. Note that, basically, the multilayer structure of the first layer 35 and the second layer 37 such as shown in FIG. 4 is employed. However, simulation is also carried out for both of a case where the second layer 37 is 0% and a case where it is 100%. That is, the simulation is also carried out for the case where the IDT electrode 3 is configured by only the first layer 35 and for the case where it is configured by only the second layer 37.

As clear also from FIG. 5, it could be confirmed that the total thickness of the IDT electrode 3 became thicker as the cut angle of the piezoelectric substrate 2 was increased from 42° to 48°. The state of change of the optimum thickness ratio at the different cut angles trended the same without regard to the cut angle. That is, it could be confirmed that the trend of the ratio of the second layer 37 relative to the total thickness of the IDT electrode 3 was the same also in the case where the cut angle was made different. Further, as confirmed, even when the ratio of the second layer 37 was changed within a range from 15% to 50% (range of 0.15 to 0.5), the total thickness of the electrode for minimizing the loss became a constant value.

When the total thickness, the thickness of the first layer 35, and the thickness of the second layer 37 of the IDT electrode 3 satisfy the relationships shown in FIG. 5, due to the presence of the second layer 37 configured by a material having a larger tensile strength than the first layer 35, in addition to the electric power resistance of the IDT electrode 3 being able to be raised, the radiation loss of the acoustic wave is suppressed and the excitation efficiency can be raised. From the above, it becomes possible to provide a SAW element 1 which is excellent in electric power resistance and has a small loss.

Note that, the relationships explained above were obtained by finding by simulation the values giving the smallest radiation loss of the acoustic wave at the resonance frequency when changing the cut angle of the piezoelectric substrate 2 and the material of the IDT electrode 3 (multilayer structure) and showing the correlation among them. Further, the validity was verified by measured values.

As such a first layer 35, use can be made of Al or an Al alloy containing Al as the principal ingredient. That is, use can be made of an Al alloy containing a sub-component in an amount less than 10%. For example, use can be made of an Al—Cu alloy formed by adding about 1% to 3% of Cu to Al, an Al—Cu—Mg alloy formed by further adding 0.5% to 3% of Mg, or the like. In this case, Cu and Mg mainly become positioned at a grain boundary of the crystal grains of Al. Note that, the first layer 35 may be made of Al containing a sub-component in a concentration of less than 5% as well. In that case, the crystallinity of Al can be raised, therefore the reliability and electrical characteristics can be improved.

Further, as the second layer 37, use can be made of a $CuAl_2$ alloy. The second layer 37 may contain impurities to an extent where segregation at the grain boundary or formation of a solid solution in the $CuAl_2$ crystal occurs. Such impurities may be for example less than 5% as well. The concentration of impurities may be made less than 2% as well.

Further, FIG. 4 showed an example of arranging the second layer 37 on the side closer to the piezoelectric substrate 2. However, the arrangement is not limited to this example. For example, the first layer 35 may be arranged on the piezoelectric substrate 2 side as well.

When the second layer 37 is arranged on the piezoelectric substrate 2 side, a second layer 37 having a stronger strength can be provided on the side closer to the piezoelectric substrate 2 having a stronger vibration, therefore it becomes possible to provide a SAW element 1 excellent in electric power resistance. Further, the center of gravity of the IDT electrode 3 can be moved downward, therefore the electromechanical coupling coefficient can be made smaller, and the propagation loss can be made smaller.

Note that, the radiation loss of the acoustic wave is also related to the density of the material configuring the IDT electrode 3. Therefore, in a case where a so-called mass-addition film is provided on the IDT electrode 3 or a case where the IDT electrode 3 is buried in the insulation material, the relationships explained above do not stand. The term "buried" means for example a case where the thickness of the insulation material is half or more of the thickness of the IDT electrode 3 or the like.

Further, the crystallinity of the second layer 37 is not particularly limited. The layer may be amorphous in state or may be polycrystalline.

Modification 1

A modification of the SAW element 1 will be explained.

The larger the ratio of the second layer 37, the higher the electric power resistance. However, the larger the ratio of the second layer 37, the higher the electric resistance of the electrode. As a result, an electrical loss becomes larger.

Therefore, the inventors studied combinations of film thicknesses not degrading the electric resistance while raising the electric power resistance by the second layer 37. Specifically, with respect to a SAW element 1 having an IDT electrode 3 satisfying the optimum film thickness ratio of the first layer 35 and the second layer 37 which was clarified in FIG. 5, the inventors ran simulations on the maximum stress applied to each of the first layer 35 and the second layer 37 and the relative electrical resistivity of the IDT electrode 3 to the comparative model. The results thereof will be shown in FIG. 6.

Figure 6:
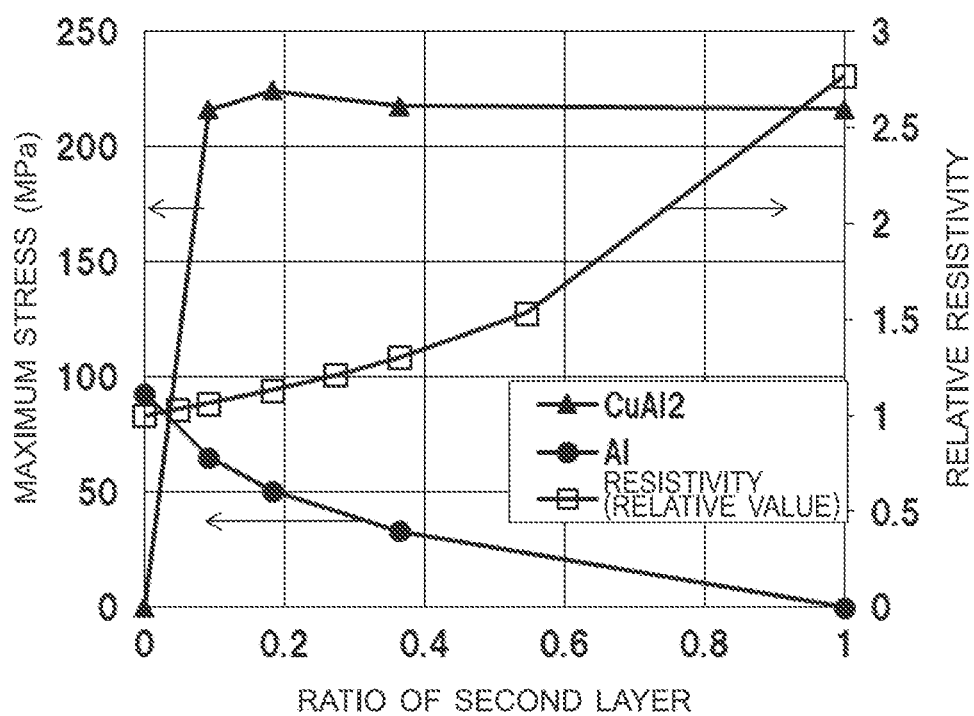
FIG. 6 is a graph showing the relationships between the ratio of the second layer relative to the total thickness of the IDT electrode 3 and the maximum stress and relative electric resistance ratio.

In FIG. 6, the abscissa shows the ratio of the thickness of the second layer 37 relative to the total thickness of the IDT electrode 3, while the ordinate shows the maximum stress (unit: MPa) on the left side and the electrical resistivity when compared with the electric resistance in a case where the IDT electrode 3 is configured by only the first layer 35 on the right side. Note that, in FIG. 6, the case where the cut angle of the piezoelectric substrate 2 is 46° is exemplified.

As clear also from FIG. 6, the state of reduction of the stress applied to the first layer 35 as the thickness of the second layer 37 became thicker could be confirmed. On the other hand, the state of the electrical resistivity rapidly becoming higher when the ratio of the second layer 37 exceeded 56% could be confirmed. The same trend of degradation of the electrical characteristics described above occurred at other cut angles as well. For this reason, the ratio of film thickness of the second layer 37 relative to the total thickness of the IDT electrode 3 may be controlled to 56% or less as well. By employing such a configuration, a SAW element 1 excellent in electric power resistance and reduced in occurrence of loss due to the electric resistance can be provided.

Further, when the cut angle of the piezoelectric substrate 2 is 46°, if the ratio of the second layer 37 is controlled to 27% or less, the electric resistance can be made substantially equal to that at the time when the IDT electrode 3 is configured only by the first layer 35.

Figure 7:
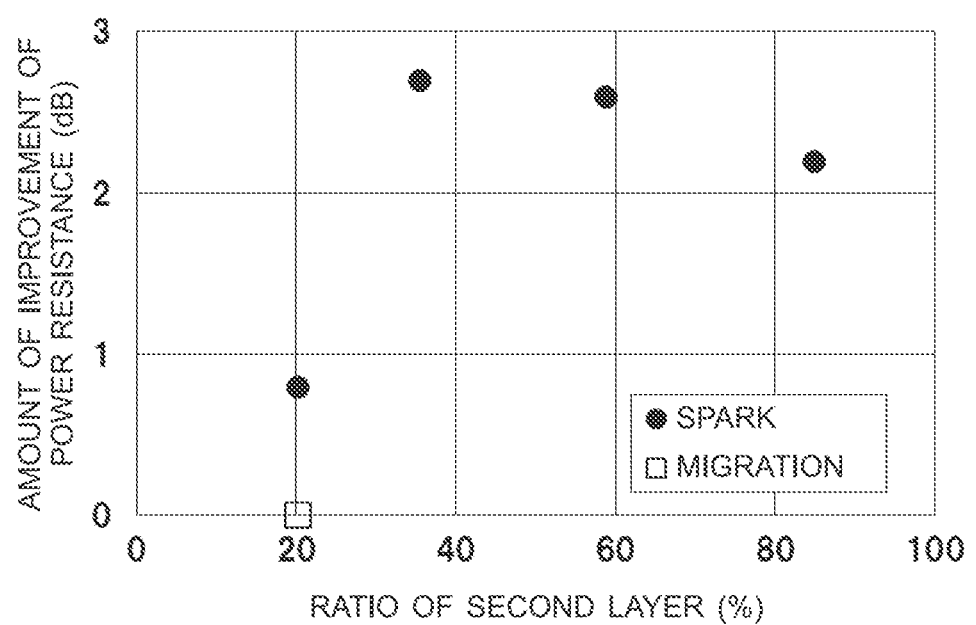
FIG. 7 is a graph showing the relationship between the ratio of the second layer relative to the total thickness of the IDT electrode 3 and an amount of improvement of breakdown power.

Next, a SAW element 1 having an IDT electrode 3 satisfying the optimum film thickness ratio of the first layer 35 and second layer 37 was prepared and was measured for breakdown power. The results thereof are shown in FIG. 7. In FIG. 7, an abscissa shows the ratio of the thickness of the second layer 37 relative to the total thickness of the IDT electrode 3, while an ordinate shows the breakdown power (unit: dBm). Note that, the breakdown of the IDT electrode 3 includes two modes of migration and spark. The electric power where each occurs is plotted.

As clear also from this graph, it was seen that the breakdown power became sharply lower if the thickness of the second layer 37 relative to the total thickness of the IDT electrode 3 became less than 20%. It was confirmed from the above that the electric power resistance could be raised by making the ratio of the thickness of the second layer 37 relative to the total thickness of the IDT electrode 3 20% or more. Note that, from the fact that in a case where the ratio of the thickness of the second layer 37 relative to the total thickness of the IDT electrode 3 exceeds 20%, the maximum stress applied to the first layer 35 becomes 50% or less compared with the case where the IDT is configured by only the first layer 35 as shown in FIG. 6, it can be confirmed that the electric power resistance of the entire IDT electrode 3 can be raised.

Modification 2

In the modification 1, the configuration optimizing the ratio of the first layer 35 and second layer 37 to thereby reduce an increase of the electric resistance was explained. However, it is also possible to adjust the cut angle of the piezoelectric substrate 2 to lower the electric resistance.

If the ratio of the second layer 37 becomes larger, the electric resistance of the electrode rises. As a result, the electrical loss becomes larger. On the other hand, as shown in FIG. 5, it is seen that the total thickness can be made thicker as the cut angle of the piezoelectric substrate 2 is made larger.

From the above, it is possible to raise the ratio of the second layer 37 to raise the electric power resistance and make the cut angle of the piezoelectric substrate 2 larger to make the electric resistance smaller. Specifically, the electric resistance of the electrode may be made the same degree or less compared with the comparative model.

In order to compare the electric resistance characteristic of the electrodes, a FOM (figure of merit) is introduced. In this example, as the FOM, use is made of a value obtained by multiplying the conductivity and the electrode thickness. Note that, in the case of a multilayer structure, the conductivities and the electrode thicknesses are multiplied for the different electrode materials and the products added to calculate the FOM of the electrode as a whole. When defining the FOM in this way, the larger the FOM, the smaller the electric resistance per unit thickness of the electrode.

Note that, in the calculation, the conductivity is expressed in units of MS/cm (conductivity of Cu: 0.588 MS/cm, conductivity of Al: 0.370 MS/cm, and conductivity of $CuAl_2$: 0.136 MS/cm) and the thickness of the electrode is represented by the ratio relative to the wavelength λ (=2×Pt). For example, in a case where the film thickness is 8% in terms of the wavelength ratio in an electrode of pure Al, FOM=0.370×0.08=0.0296 stands. Further, in a case where the film thickness of Cu is 3% and the film thickness of Al is 4%, FOM=0.588×0.03+0.370×0.04=0.0325 stands.

Therefore, for an IDT electrode 3 satisfying each optimum film thickness ratio shown in FIG. 5, FOM values when making the cut angle of the piezoelectric substrate 2 different were calculated. Note that, the FOM in the comparative model is 0.0296.

As a result, it was confirmed that, when the cut angle was made larger, the FOM value became larger and the ratio of the second layer 37 capable of manifesting electrical characteristics at least equal to those in the comparative model could be made larger. Specifically, in terms of (cut angle, ratio of second layer 37, total thickness), the FOM at the time of (42°, 0.3, 0.08λ) is 0.0330, and the FOM at the time of (46°, 0.3, 0.12λ) is 0.0360. In this way, it was seen that electrical characteristics at least equal to those in the comparative model were realized in any case. Further, the FOM becomes larger as the cut angle is made larger. The FOM is greatly improved compared with comparative model. Therefore, it was confirmed that electrical characteristics at least equal to those in the comparative model could be obtained even if the ratio of the second layer having a low conductivity was increased (in this case, even if the ratio of the second layer was made 0.5).

Modification 3

Figure 8:
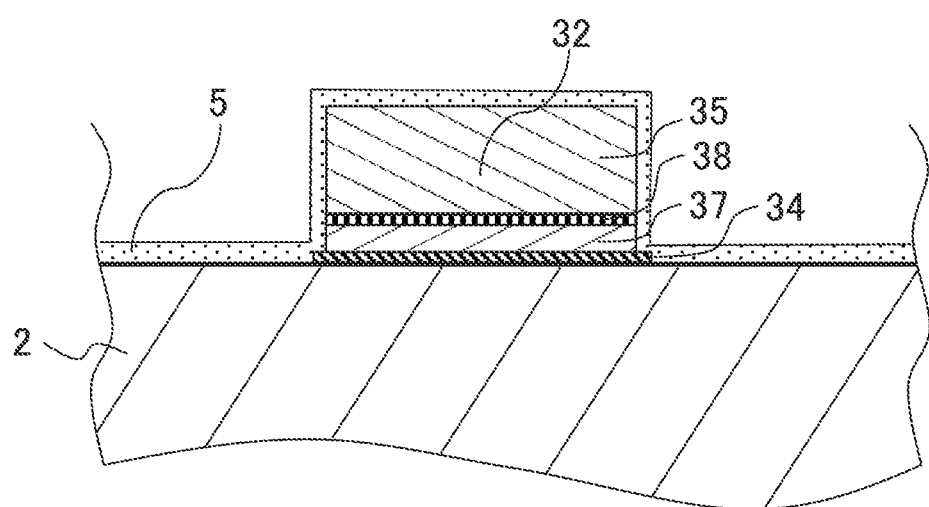
FIG. 8 is an enlarged cross-sectional view of the principal part showing a modification of the acoustic wave element.

In the example explained above, the case where the first layer 35 and second layer 37 were stacked in order on the piezoelectric substrate 2 was explained. However, the configuration is not limited to this. For example, as shown in FIG. 8, an intermediate layer 38 may be provided between the first layer 35 and the second layer 37 as well.

The intermediate layer 38 is configured by a material which is low in reactivity with Cu and Al and is higher in the strength than Al. For example, it may be configured by a layer made of a material which is chemically stable and has conductivity such as Ti or Cr or a laminate thereof. By providing the intermediate layer 38, diffusion between the first layer 35 and the second layer 37 can be reduced. As a result, a SAW element 1 having stable characteristics can be provided.

Further, when Ti is used as the intermediate layer 38 and the first layer 35 is formed on that, the crystal of Al can be made grow in the <111> direction, therefore a first layer 35 excellent in crystallinity can be obtained For this reason, occurrence of a defect causing breakage can be reduced, so the electric power resistance can be raised.

The thickness of such an intermediate layer 38 is controlled to a thickness within a range not influencing the electrical characteristics etc. of the IDT electrode 3. For example, it may be made a value of 3 nm or more and 5% or less of the total thickness of the IDT electrode 3. By setting such a thickness, it is possible to realize a diffusion prevention function of the element between the layers which are positioned above and below each other and there is no adverse influence upon the excitation of the acoustic wave and the electric resistance of the electrode.

Note that, in the example shown in FIG. 8, the underlying layer 34 is positioned on the lower side of the second layer 37. As such an underlying layer 34, for example use can be made of Ti etc.

Note that the thicknesses of the intermediate layer 38 and underlying layer 34 are excluded from the total thickness of the IDT electrode 3 and the relative film thickness of the second layer 37 etc. found in FIGS. 5, 7, 8 and the like.

Further, in the example shown in FIG. 8, the explanation was given by taking as an example the case where one first layer 35 and one second layer 37 were provided. However, there may be pluralities of the first layer 35 and second layer 37 as well. In that case, each first layer 35 and each second layer 37 may be alternately stacked and the intermediate layer 38 may be provided between each two or the intermediate layer 38 may be provided between the two in at least part.

Further, in addition to the part between the first layer 35 and the second layer 37, one or more intermediate layers 38 may be provided in the middle of the thickness of the first layer 35. In this case, migration in the first layer 35 can be reduced, therefore the electric power resistance can be improved. Further, compared with the case where the intermediate layer 38 is not provided in the middle of the thickness of the first layer 35, by providing the intermediate layer 38 in the middle of the thickness of the first layer 35, the size of the Al crystal grain configuring the first layer 35 can be made smaller. From this fact as well, the electric power resistance of the IDT electrode 3 can be raised.

Modification 4

Figure 9:
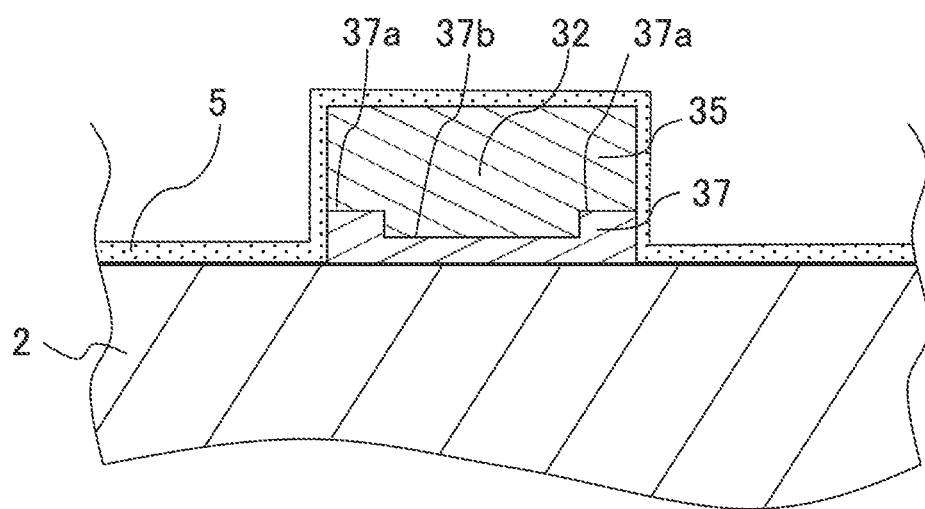
FIG. 9 is an enlarged cross-sectional view of the principal part showing a modification of the acoustic wave element.
Figure 9:
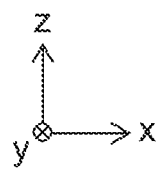

In the example explained above, the cross-sectional shape of the first layer 35 and the second layer 37 in the thickness direction was rectangular. However, the shape is not limited to this. For example, it may be a trapezoidal shape. Otherwise, as shown in FIG. 9, a part having a thin thickness may be present at a position separated from the outer edge in the width direction of the electrode fingers 32 as well. By employing such a configuration, a SAW element capable of reducing the loss due to the electric resistance while raising the electric power resistance can be provided. Below, the mechanism thereof will be explained.

Figure 10:
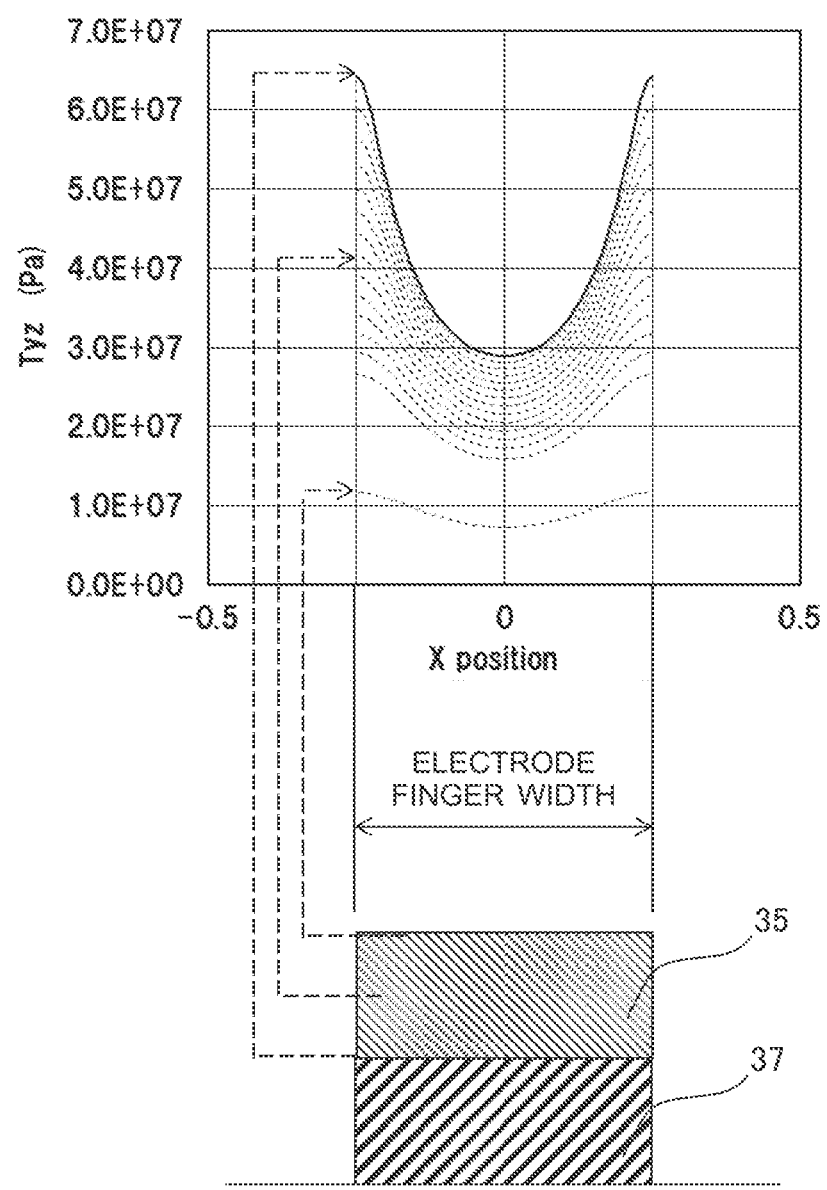
FIG. 10 is a graph showing a stress distribution of electrode fingers 32.

The stress distribution in the plane of the electrode fingers 32 in the IDT electrode 3 at the time when a high frequency signal was input to the IDT electrode 3 was simulated. The results thereof will be shown in FIG. 10. In FIG. 10, the abscissa shows the position in the width direction of the electrode fingers 32, and the ordinate shows the maximum stress (dBm). As clear also from FIG. 10, a state where that the stress applied to the electrode fingers 32 was the largest at the outer edge and became smaller toward the vicinity of the center of the width was confirmed.

It is estimated from this that the electric power resistance can be maintained even if the second layer 37 excellent in electric power resistance is made larger in thickness at the peripheral part of the outer edge where the stress is larger and is made smaller in thickness at the inner side from the peripheral part of the outer edge. In particular, it is estimated that the electric power resistance is maintained even if the thickness is made smaller in the vicinity of the center.

The example shown in FIG. 9 shows a shape where the thickness of an outer peripheral part continuing from the outer edge is large and the thickness of the center part 37*b* surrounded by the outer peripheral part 37*a* is small. Further, the first layer 35 enters into the region recessed by the center part 37*b*. That is, the thickness of the center part 37*b* becomes smaller compared with the periphery. By making the outer peripheral part 37*a* having a larger thickness positioned in a place where the stress is large and making the center part 37*b* having a small thickness positioned in a place where the stress is small in this way, the electric power resistance can be improved.

Note that, in such a case, the ratios of the thicknesses of the first layer 35 and the second layer 37 are corrected in accordance with the volume.

Figure 11:
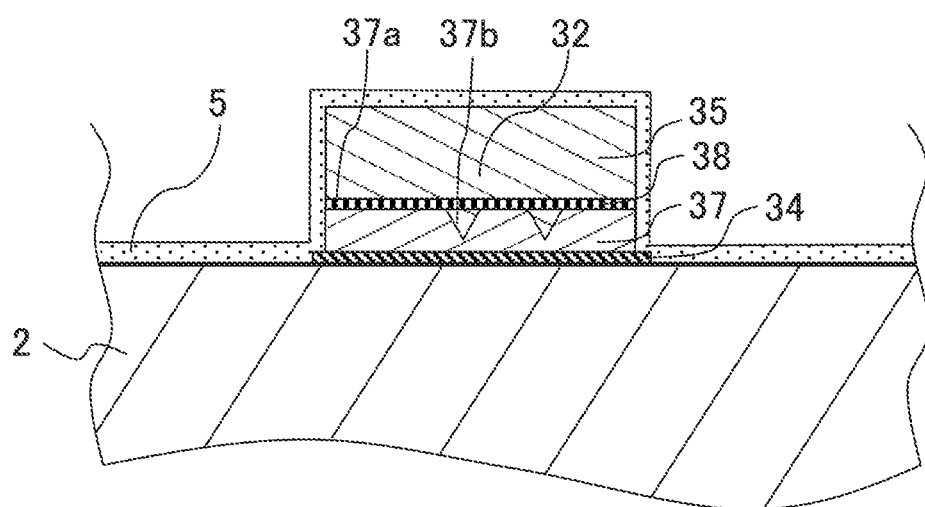
FIG. 11 is an enlarged cross-sectional view of the principal part showing a modification of the acoustic wave element.

Further, the configuration where a part having a small thickness is present at a position separated from the outer edge in the width direction of the electrode fingers 32 is not limited to FIG. 9. For example, when viewed by a cross-section in the thickness direction, a region which continuously becomes smaller in thickness linearly or in a curve state the more separated from the outer edge may be provided, a region which becomes smaller in thickness stepwise may be provided, or the shape may be a V-shape or mortar shape. Further, as shown in FIG. 11, two or more center parts 37*b* may be provided as well.

In these cases, the intermediate layer 38 may be provided as well. The intermediate layer 38 may be provided along the shape of the upper surface of the second layer 37 or may be provided at the height position matching with the upper surface of the outer peripheral part 37*a* as shown in FIG. 11.

Modification 5

In the example explained above, the explanation was given by taking as an example a case where the first layer 35 was a single layer of Al and there was no gradient in concentration in the thickness direction, but the first layer is not limited to this. That is, the first layer 35 may be provided with a gradient of concentration in the thickness direction as well. Specifically, the sub-component of the first layer 35 may be provided with a gradient of concentration in the thickness direction as well.

Figure 15A:
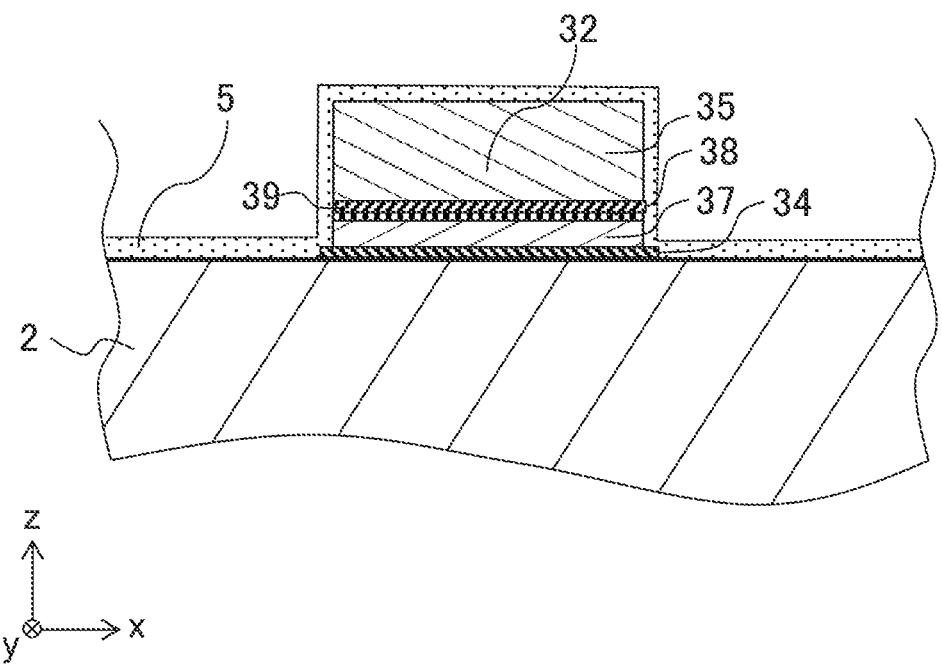
FIG. 15A and FIG. 15B are enlarged cross-sectional views of principal parts showing modifications of the acoustic wave element in the present disclosure.

For example, as shown in FIG. 15A, the first layer 35 may be provided with a layered region 39 containing a lot of Cu at the intermediate layer 38 side.

In the case of the configuration shown in FIG. 15A, by providing the region 39 containing a lot of Cu having a higher electric power resistance compared with Al at a position near the piezoelectric substrate 2 having a large vibration, the electric power resistance of the SAW element can be raised.

Figure 15B:
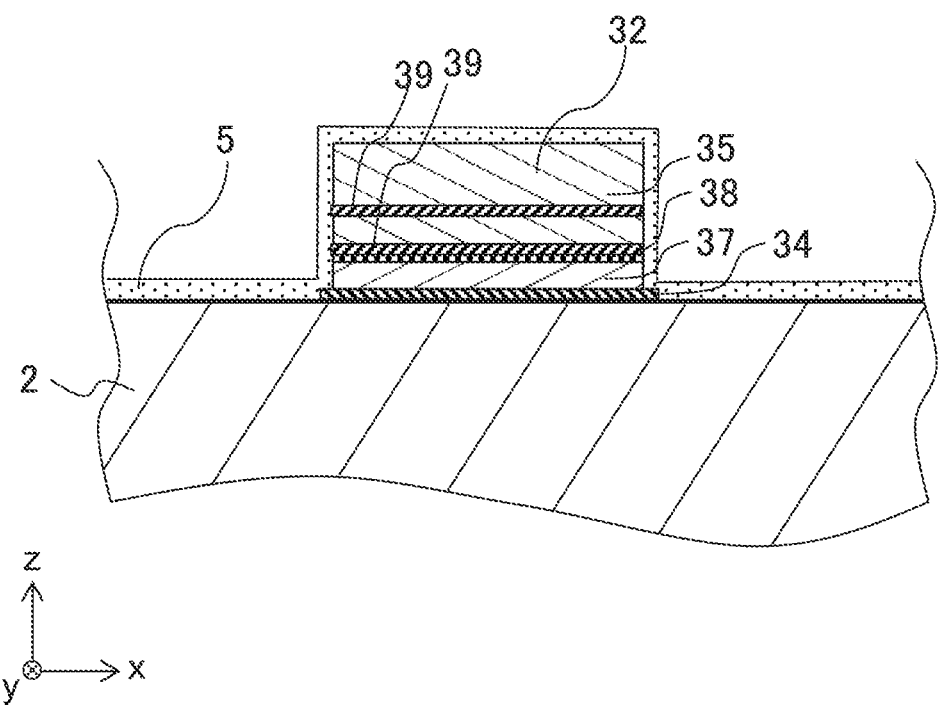

Further, as shown in FIG. 15B, two or more regions 39 may be provided in the middle of the thickness of the first layer 35 as well. Even in this case, the electric power resistance can be raised. This is because, in addition to the electric power resistance being raised by making the grain size of Al smaller, the electric power resistance can be raised by forming a pseudo Al—Cu added alloy by making Cu diffuse from the region 39 to the grain boundary of the crystal of Al.

Note that, in both of FIG. 15A and FIG. 15B, the thickness and composition of the region 39 are adjusted so that the Cu concentration in the entire first layer 35 including the region 39 becomes the sub-component not more than 10%. The region 39 may contain Cu as the principal ingredient or may be an alloy such as $CuAl_2$. Further, a gradient of concentration where the concentration gradually becomes smaller toward the two sides or one side of the thickness direction from the region 39 may be provided.

Other Modifications

Further, in the example shown in FIG. 2, the explanation was given by taking as an example a case where use was made of a sufficiently thick piezoelectric substrate 2. However, a so-called bonded substrate formed by using a thin piezoelectric substrate 2 and bonding a support substrate to the lower surface of the piezoelectric substrate may be used as well. In this case, the thickness of the piezoelectric substrate 2 may be made for example about 0.5 μm to 20 μm, and the support substrate may be given a thickness larger enough to support the piezoelectric substrate 2. In particular, where a sapphire substrate or Si substrate etc. is used, deformation of the piezoelectric substrate 2 due to a temperature change can be reduced, therefore a SAW element excellent in temperature characteristic can be provided. Note that, the thickness of the piezoelectric substrate 2 may be made 0.2λ to 10λ in terms of wavelength ratio. Further, between the piezoelectric substrate 2 and the support substrate, a junction layer, an acoustic intermediate layer, or the like may be positioned as well.

Further, in the example explained above, the explanation was given by taking as an example a case where the IDT electrode 3 had a uniform layer configuration and thickness. However, it is sufficient that the electrode fingers 32 satisfy the relationships explained above in the region where the electrode fingers 32 intersect each other. The configuration is not limited to this. For example, the bus bars 31 may have a larger thickness compared with the electrode fingers 32 or may be provided with a different layer configuration.

Note that, the characteristics of the formulas derived in the examples explained above were confirmed to be similar in the trend of increase of the total thickness of the IDT electrode 3 even if the cut angle of the piezoelectric substrate 2 is 50° or more. Note that, the match between the measured values and the simulation values is confirmed up to when the cut angle is 50°.

Example

Figure 14:
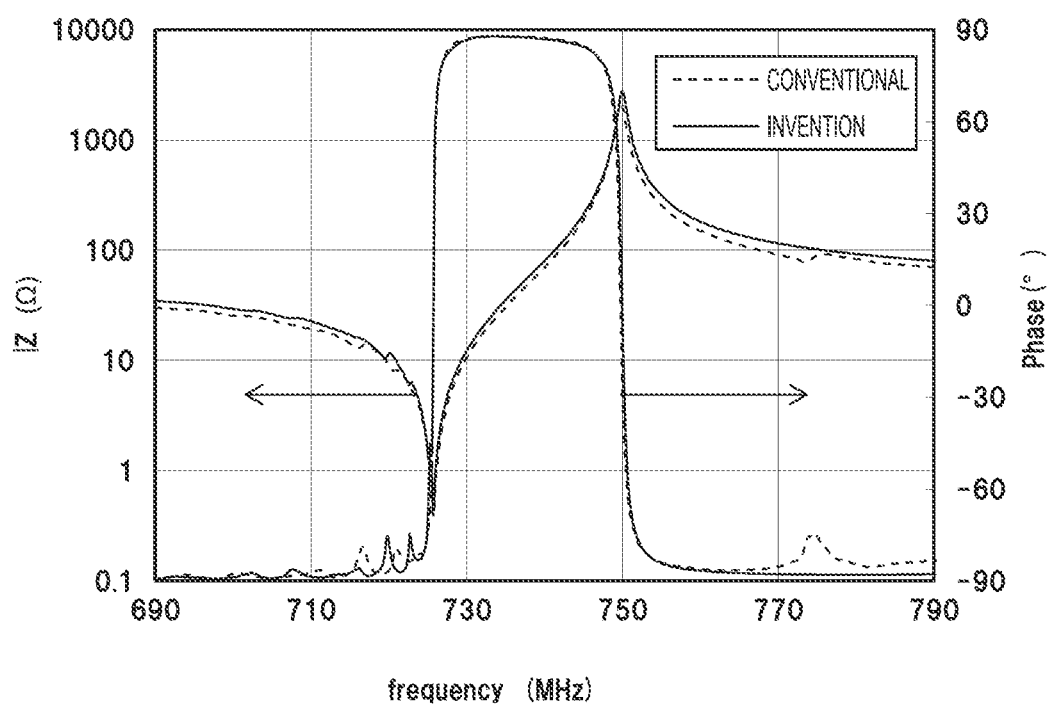
FIG. 14 is a graph showing frequency characteristics of an example and comparative example.

The SAW element 1 shown in FIG. 8 and the SAW element in the comparative model were prepared, and the breakdown powers were measured. The specific conditions were as follows:

Piezoelectric substrate 2: 46°-rotated, Y-cut, X-propagated lithium tantalate substrate
IDT electrode 3: 2.7 μm of pitch, 0.5 of duty, and 100 electrode fingers 32
First layer 35: Material . . . Al, Thickness . . . 541 nm
Second layer 37: Material . . . $CuAl_2$, Thickness . . . 54 nm
Underlying layer 34: Material . . . Ti, Thickness . . . 6 nm
Intermediate layer 38: Material . . . Ti, Thickness . . . 6 nm The breakdown power of the SAW element according to the example was improved by 3 dB compared with the breakdown power of the SAW element in the comparative model. This is synonymous with improvement about 1000 times when converted into time. As described above, it was confirmed that the SAW element in the present disclosure was provided with a high electric power resistance. Further, the results of measurement of the frequency characteristics of the SAW element according to the example will be shown in FIG. 14. As clear also from FIG. 14, it was confirmed that the both of the SAW elements in the comparative model and the example realized good resonance characteristics.

<Filter Element and Communication Apparatus>

Figure 12:
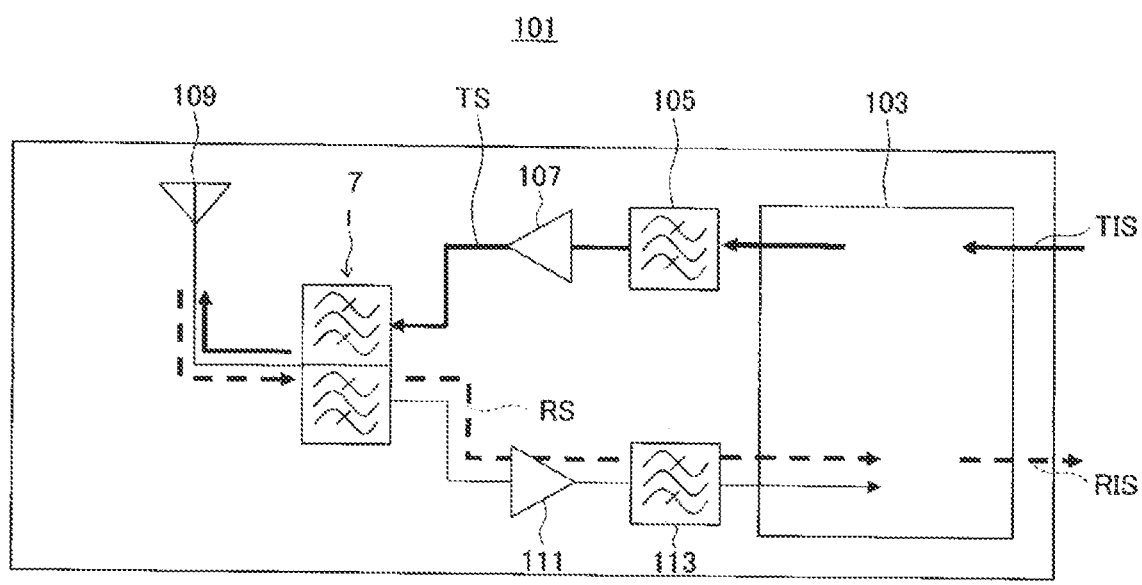
FIG. 12 is a schematic view explaining a communication apparatus according to one embodiment of the present disclosure.

FIG. 12 is a block diagram showing the principal part in a communication apparatus 101 according to an embodiment of the present disclosure. The communication apparatus 101 performs wireless communication utilizing radio waves. The multiplexer 7 has the function of branching a signal having the transmission frequency and a signal having the reception frequency in the communication apparatus 101.

In the communication apparatus 101, a transmission information signal TIS including information to be transmitted is modulated and raised in frequency (conversion to a high frequency signal having a carrier frequency) by an RF-IC 103 to become a transmission signal TS. The transmission signal TS is stripped of unwanted components other than the transmission-use passing band by a band pass filter 105, is amplified by an amplifier 107, and is input to the multiplexer 7. The multiplexer 7 strips the unwanted components other than the transmission-use passing band from the input transmission signal TS and outputs the result to an antenna 109. The antenna 109 converts the input electrical signal (transmission signal TS) to a wireless signal and transmits the result.

In the communication apparatus 101, the wireless signal received by the antenna 109 is converted to an electrical signal (reception signal RS) by the antenna 109 and is input to the multiplexer 7. The multiplexer 7 strips unwanted components other than the reception-use passing band from the input reception signal RS and outputs the result to an amplifier 111. The output reception signal RS is amplified by the amplifier 111 and is stripped of unwanted components other than the reception-use passing band by a band pass filter 113. Further, the reception signal RS is boosted down in frequency and demodulated by the RF-IC 103 to become the reception information signal RIS.

The transmission information signal TIS and reception information signal RIS may be low frequency signals (baseband signals) containing suitable information. For example, they are analog audio signals or digital audio signals. The passing band of the radio signal may be one according to the UMTS (Universal Mobile Telecommunications System) or other various standards. The modulation scheme may be a phase modulation, amplitude modulation, frequency modulation, or a combination of any two or more among them.

Figure 13:
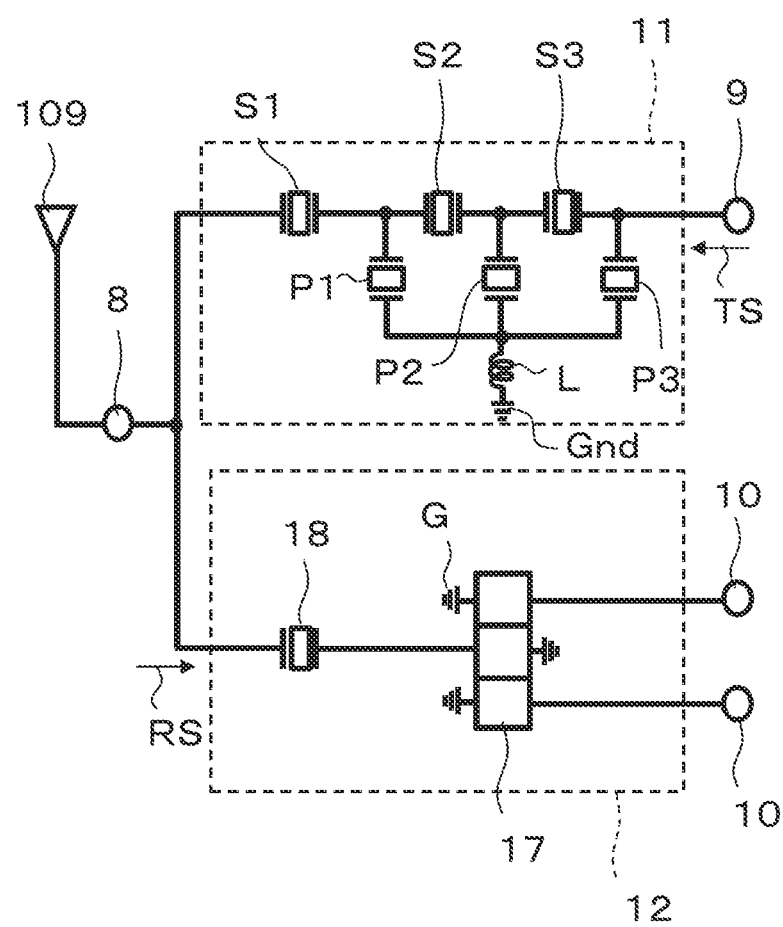
FIG. 13 is a circuit diagram explaining a multiplexer according to one embodiment of the present disclosure.

FIG. 13 is a circuit diagram showing the configuration of a multiplexer 7 according to one embodiment of the present disclosure. The multiplexer 7 is a multiplexer used in the communication apparatus 101 in FIG. 12. The multiplexer 7 has a filter element configuring a transmission filter 11 and/or receiving filter 12. The filter element configuring the transmission filter 11 and/or receiving filter 12 is configured by the SAW element 1 and a resonator arranged on the piezoelectric substrate 2.

The SAW element 1 is for example a SAW element configuring part of a ladder type filter circuit in the transmission filter 11 in the multiplexer 7 shown in FIG. 12. The transmission filter 11, as shown in FIG. 13, has the piezoelectric substrate 2 and serial resonators S1 to S3 and parallel resonators P1 to P3 which are all formed on the piezoelectric substrate 2.

The multiplexer 7 is mainly configured by an antenna terminal 8, transmission terminal 9, reception terminals 10, transmission filter 11 arranged between the antenna terminal 8 and the transmission terminal 9, and receiving filter 12 arranged between the antenna terminal 8 and the reception terminals 10.

The transmission terminal 9 receives as input the transmission signal TS from the amplifier 107. The transmission signal TS input to the transmission terminal 9 is stripped of unwanted components other than the transmission-use passing band in the transmission filter 11 and the result is output to the antenna terminal 8. Further, the antenna terminal 8 receives as input the reception signal RS from the antenna 109. The signal is stripped of unwanted components other than the reception-use passing band in the reception filter 12 and the result is output to the reception terminals 10.

The transmission filter 11 is for example configured by a ladder type SAW filter. Specifically, the transmission filter 11 has three serial resonators S1, S2, and S3 which are connected in series between its input side and the output side and three parallel resonators P1, P2, and P3 which are provided between a serial arm forming a wiring for connecting the serial resonators to each other and a reference potential part Gnd. That is, the transmission filter 11 is a ladder type filter having a 3-stage configuration. However, in the transmission filter 11, there may be any number of stages of the ladder type filter.

Between the parallel resonators P1, P2, and P3 and the reference potential part Gnd, an inductor L is provided. By setting an inductance of this inductor L to a predetermined magnitude, an attenuation pole is formed out of the band of the passing frequency of the transmission signal and thereby make the out-of-band attenuation larger. Each of the plurality of serial resonators S1, S2, and S3 and plurality of parallel resonators P1, P2, and P3 is configured by a SAW resonator like the SAW element 1.

The receiving filter 12 for example has a multimode type SAW filter 17 and an auxiliary resonator 18 connected in series to the input side of the multimode type SAW filter 17. Note that, in the present embodiment, the multimode includes a double mode. The multimode type SAW filter 17 has a balance-unbalance conversion function, and the receiving filter 12 is connected to the two reception terminals 10 from which the balanced signals are output. The receiving filter 12 is not limited to one configured by the multimode type SAW filter 17 and may be configured by a ladder type filter or may be a filter without having a balance-unbalance conversion function.

Between the connection point of the transmission filter 11, receiving filter 12, and antenna terminal 8 and the ground potential part an impedance matching-use circuit configured by an inductor or the like may be inserted as well.

The SAW element in the present embodiment may be used in any of the serial resonators S1 to S3 or any of the parallel resonators P1 to P3. By using the SAW element 1 in at least one of the parallel resonators P1 to P3, the electric power resistance of the filter can be raised.

Further, the electrode design of the SAW element 1 may be made different for each frequency as well. Specifically, for example, the electrode configuration and the cut angle of the piezoelectric substrate which configure the SAW element 1 may be different between the transmission filter 11 and the receiving filter 12 as well. Further, irrespective of transmission/reception, the electrode configuration and the cut angle of the piezoelectric substrate which configure the SAW element 1 may be different between a filter having a high passing band and a filter having a low passing band as well. For example, in the filter on a low frequency side, the cut angle of the piezoelectric substrate may be made larger than that in the filter on a high frequency side to design the IDT electrodes 3 in the present application as well.

Further, on the side of the filter having a multimode type SAW filter having a lower electric power resistance compared with the ladder type filter, IDT electrodes 3 having a higher electric power resistance (having a ratio of second layer made larger) by making the cut angle larger may be employed as well.

REFERENCE SIGNS LIST 1 acoustic wave element (SAW element)
2 piezoelectric substrate
2A upper surface
3 excitation (IDT) electrode
35 first layer
37 second layer
38 intermediate layer
4 reflector
5 protective layer
7 multiplexer
8 antenna terminal
9 transmission terminal
10 reception terminal
11 transmission filter
12 receiving filter
15 conductive layer
17 multimode type SAW filter
18 auxiliary resonator
101 communication apparatus
103 RF-IC
105 bandpass filter
107 amplifier
109 antenna
111 amplifier
113 bandpass filter
S1 to S3 serial resonators
P1 to P3 parallel resonators

The invention claimed is:

1. An acoustic wave element comprising:
a piezoelectric substrate comprising a surface; and
an IDT electrode located on the surface, the IDT electrode comprising:
one or more first layers, wherein all layers containing Al with 10% or less of a sub-component are the one or more first layers;
one or more second layers containing a CuAl$_2$ alloy; and
a position in a direction parallel to the surface, wherein a ratio, at the position, of a total thickness of all of the one or more second layers to a total thickness of all of the one or more first layers and all of the one or more second layers is 20% or more, and
wherein one of the one or more second layers directly contacts the piezoelectric substrate or contacts the piezoelectric substrate with a Ti layer therebetween.

2. A filter element in which at least one acoustic wave element according to claim 1 and at least one resonator on the piezoelectric substrate are connected in a ladder shape.

3. A communication apparatus comprising:
an antenna,
the filter element according to claim 2 which is electrically connected with the antenna, and
an RF-IC which is electrically connected with the filter element.

4. The acoustic wave element according to claim 1, wherein the ratio is 56% or less.

5. The acoustic wave element according to claim 1, further comprising an intermediate layer having electrical conductivity between the first layer and the second layer.

6. The acoustic wave element according to claim 1, wherein the piezoelectric substrate is comprised of a Y-rotated and X-propagated lithium tantalate single crystal substrate, and its cut angle is 46° or more.

7. The acoustic wave element according to claim 1, wherein the second layer comprises a part having a thinner thickness compared with a periphery, the part being at a position separated from an outer edge and extending to an inner portion.

8. The acoustic wave element according to claim 1, wherein: the second layer is lower in crystallinity than the first layer.

9. The acoustic wave element according to claim 1, comprising an underlying layer having conductivity between the piezoelectric substrate and the IDT electrode, the underlying layer being broader in a width contacting the piezoelectric substrate than a width contacting an electrode finger of the IDT electrode when viewed by a cross-section.

10. The acoustic wave element according to claim 1, wherein the sub-component comprises Cu, and the one or more first layers have a gradient of concentration of Cu in a thickness direction.

11. An acoustic wave element comprising:
a piezoelectric substrate; and
an IDT electrode which is located on the piezoelectric substrate and comprises a multilayer structure of a first layer comprised of Al containing 10% or less of a sub-component and a second layer comprised of a CuAl$_2$ alloy,
wherein the second layer directly contacts the piezoelectric substrate or contacts the piezoelectric substrate with a Ti layer interposed therebetween, and
wherein neither an Al layer nor an Al alloy layer is between the piezoelectric substrate and the second layer.

* * * * *